(12) United States Patent  
Scanlan et al.

(10) Patent No.: US 9,269,622 B2  
(45) Date of Patent: Feb. 23, 2016

(54) SEMICONDUCTOR DEVICE AND METHOD OF LAND GRID ARRAY PACKAGING WITH BUSSING LINES

(71) Applicant: DECA Technologies Inc., Tempe, AZ (US)

(72) Inventors: Christopher M. Scanlan, Chandler, AZ (US); Timothy L. Olson, Phoenix, AZ (US)

(73) Assignee: DECA Technologies Inc., Tempe, AZ (US)

( * ) Notice: Subject to any disclaimer, the term of this patent is extended or adjusted under 35 U.S.C. 154(b) by 95 days.

(21) Appl. No.: 13/891,056

(22) Filed: May 9, 2013

(65) Prior Publication Data

US 2014/0335658 A1    Nov. 13, 2014

(51) Int. Cl.
*H01L 21/78* (2006.01)
*H01L 23/00* (2006.01)
*H01L 21/56* (2006.01)

(52) U.S. Cl.
CPC .............. *H01L 21/78* (2013.01); *H01L 24/19* (2013.01); *H01L 24/96* (2013.01); *H01L 21/568* (2013.01); *H01L 2224/12105* (2013.01); *H01L 2924/12041* (2013.01); *H01L 2924/12042* (2013.01); *H01L 2924/13091* (2013.01); *H01L 2924/181* (2013.01); *H01L 2924/18162* (2013.01)

(58) Field of Classification Search
CPC .................................. H01L 33/08; H01L 21/78
See application file for complete search history.

(56) References Cited

U.S. PATENT DOCUMENTS

| | | | |
|---|---|---|---|
| 6,121,065 A * | 9/2000 | Wong et al. | 438/17 |
| 7,456,496 B2 | 11/2008 | Hwee et al. | |
| 7,476,980 B2 | 1/2009 | Rebibis et al. | |
| 7,829,380 B2 | 11/2010 | Irsigler et al. | |
| 8,030,770 B1 | 10/2011 | Juskey et al. | |
| 8,487,435 B2 | 7/2013 | Juskey et al. | |
| 2007/0278701 A1 * | 12/2007 | Chang et al. | 257/787 |
| 2009/0212428 A1 * | 8/2009 | Yang et al. | 257/738 |
| 2011/0156239 A1 | 6/2011 | Jin | |
| 2011/0202896 A1 | 8/2011 | Scanlan et al. | |
| 2011/0285007 A1 * | 11/2011 | Chi et al. | 257/686 |
| 2012/0228754 A1 | 9/2012 | Liu et al. | |
| 2013/0075924 A1 | 3/2013 | Lin et al. | |
| 2013/0168830 A1 * | 7/2013 | Uehling | 257/620 |

* cited by examiner

*Primary Examiner* — Matthew Reames
(74) *Attorney, Agent, or Firm* — Booth Udall Fuller, PLC

(57) ABSTRACT

A semiconductor device and method of making a semiconductor device is described. An embedded die panel comprising a plurality of semiconductor die separated by saw streets is provided. A conductive layer is formed by an electroless plating process, the conductive layer comprising bussing lines disposed in the saw streets and a redistribution layer (RDL) coupled to the semiconductor die and bussing lines. An insulating layer is formed over the conductive layer and embedded die panel, the insulating layer comprising openings disposed over the conductive layer outside a footprint of the semiconductor die. Interconnect structures are formed in the openings in the insulating layer by using the conductive layer as part of an electroplating process. The embedded die panel is singulated through the saw streets after forming the interconnect structures to remove the bussing lines and to from individual fan-out wafer level packages (FOWLPs).

20 Claims, 8 Drawing Sheets

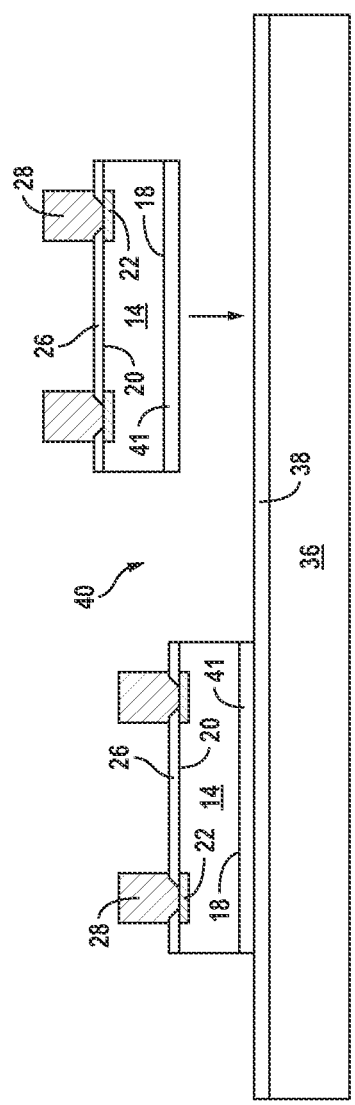
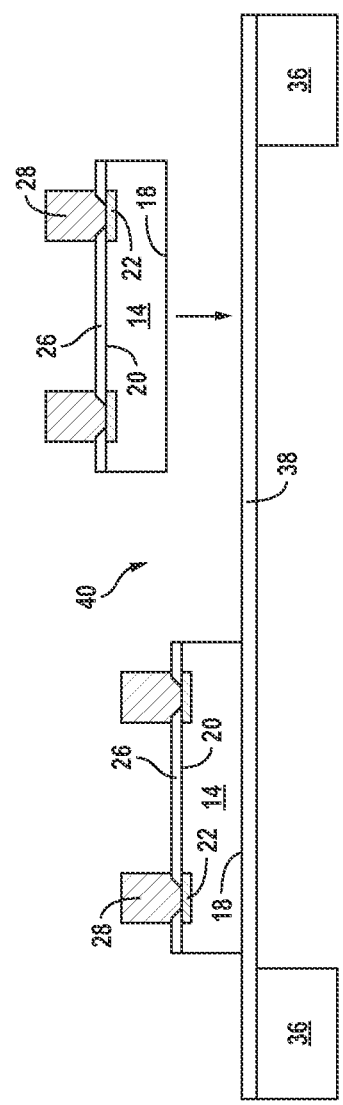

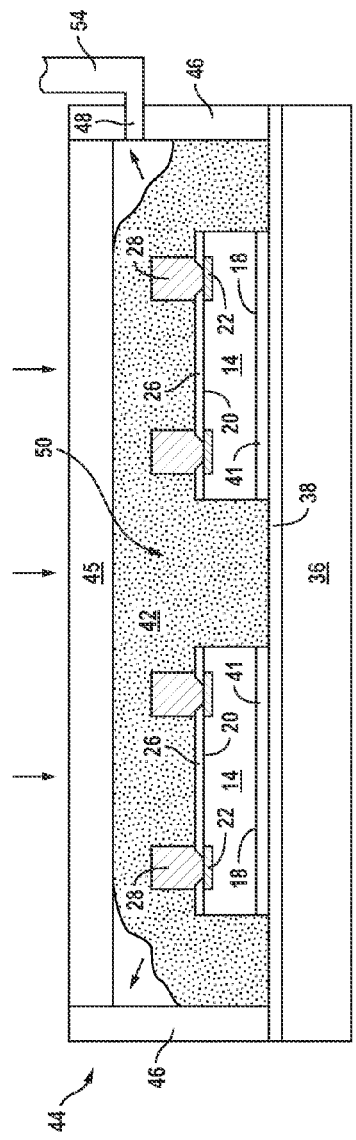
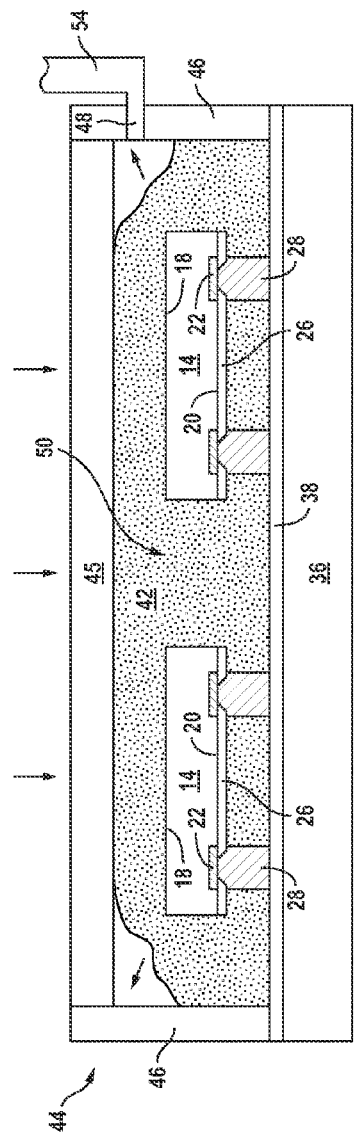
FIG. 2C
FIG. 2D

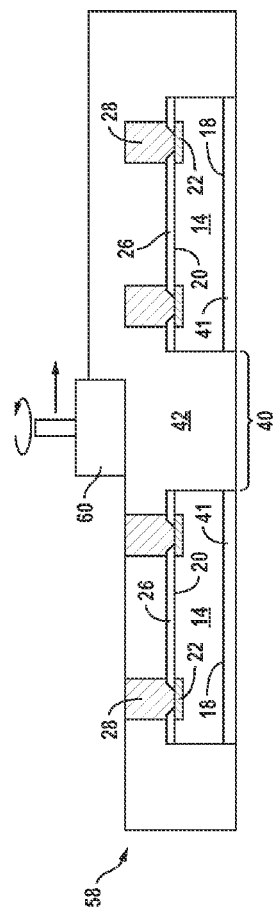
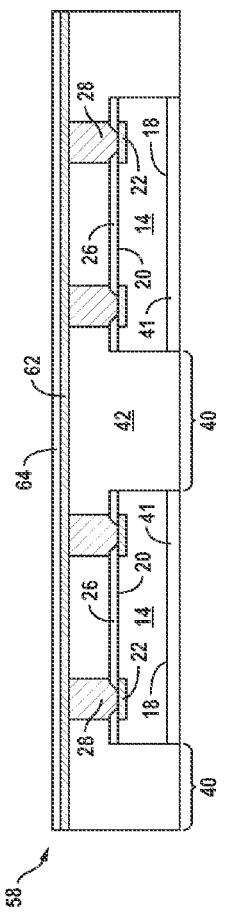
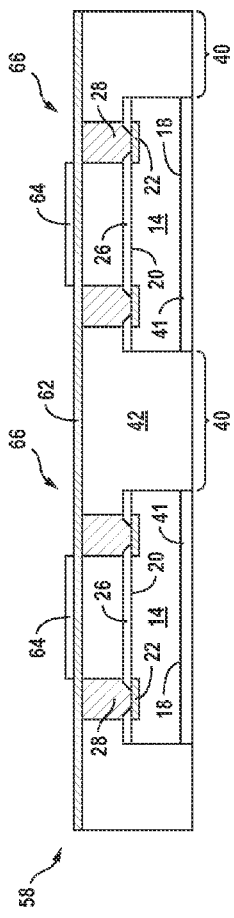

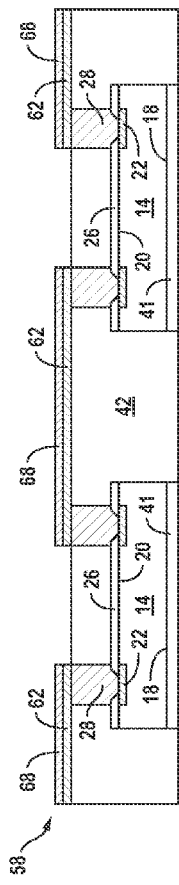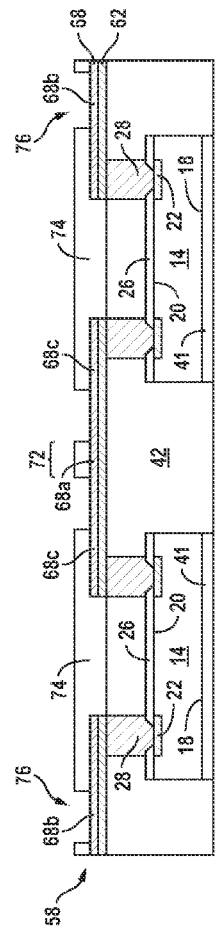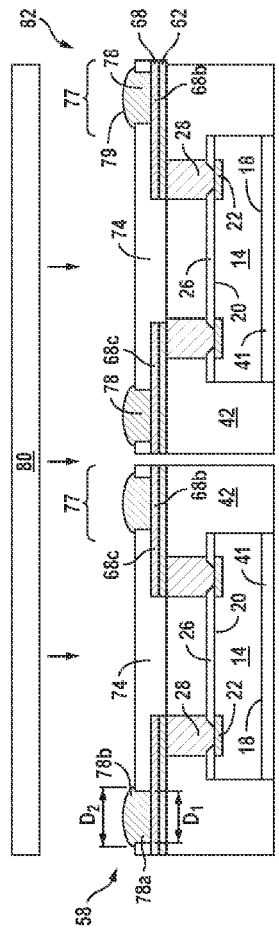

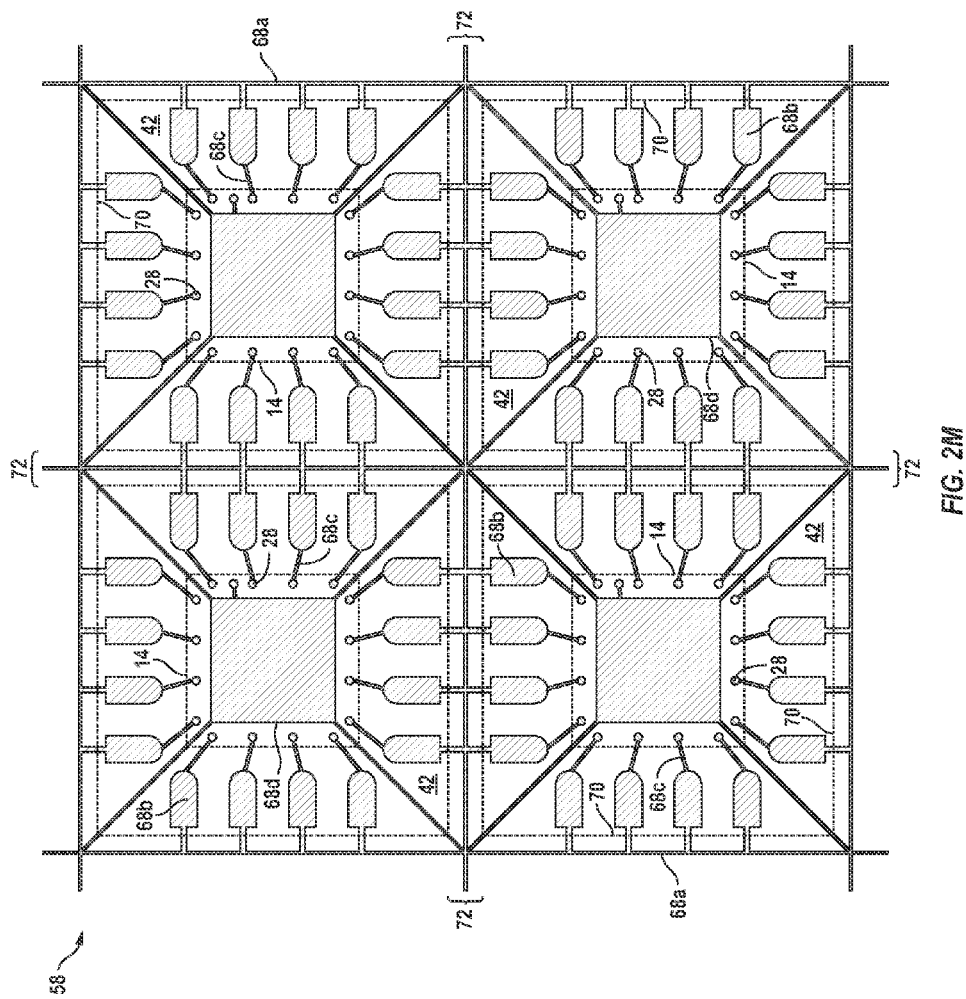

SEMICONDUCTOR DEVICE AND METHOD OF LAND GRID ARRAY PACKAGING WITH BUSSING LINES

TECHNICAL FIELD

The disclosure relates in general to semiconductor devices and, more particularly, to the formation of semiconductor devices comprising land grid arrays (LGAs) and bussing lines.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Back-end processing of semiconductor die includes a number of surface mount technologies (SMT) that are used to connect semiconductor die or integrated circuits to surfaces of substrates and printed circuit boards (PCBs) without the use of through holes in the PCBs. Quad Flat Packages (QFP) use SMT that includes leads that extend from each of the four sides of the package, sometimes referred to as "gull wing leads." QFP leads provide electrical Input/Output (I/O) interconnection between the semiconductor die within the package and the PCB or substrate to which the QFP is mounted. Other SMT packages are made without leads and are commonly referred to flat no lead packages. Examples of flat no lead packages are Quad-flat no leads packages (QFNs) and dual-flat no lead (DFN) packages. QFN packages conventionally include a semiconductor die connected by wirebonds to a leadframe that is used for package I/O interconnection.

One approach to back-end processing that more efficiently produces packaged semiconductor devices is the use of panelized packaging, in which a number of semiconductor die are formed into a panel and processed simultaneously at a level of a reconstituted wafer or panel. One form of panelized packaging used to package semiconductor die is fan-out wafer level packaging (FOWLP). FOWLPs involve placing multiple semiconductor die "face down" or with an active surface of the semiconductor die oriented toward a temporary carrier or substrate, such as a temporary tape carrier. FOWLPs can also be fabricated by placing the semiconductor die "face up" on a temporary or permanent carrier. The semiconductor die and substrate or carrier is overmolded with an encapsulant, such as an epoxy molding compound, using, for example, a compression molding process. After molding, the carrier tape is removed to expose the active surface or the back surface of the multiple semiconductor die formed together as a reconstituted wafer. Subsequently, a wafer level chip scale package (WLCSP) build-up interconnect structure is formed on top of the reconstituted wafer. Conductive bumps can then formed over the build-up interconnect structure as a ball grid array (BGA), which is attached to the reconstituted wafer. After formation of the BGA, the reconstituted wafer is singulated to form individual semiconductor devices or BGA packages. BGA packages can provide more package I/O connections than are provided by flat packages.

SUMMARY

The foregoing and other aspects, features, and advantages will be apparent to those artisans of ordinary skill in the art from the DESCRIPTION and DRAWINGS, and from the CLAIMS.

Accordingly, in one aspect, the present invention is a method of making a semiconductor device that can comprise providing an embedded die panel comprising a plurality of semiconductor die separated by saw streets, forming a conductive layer by an electroless plating process that comprises bussing lines disposed in the saw streets and a redistribution layer (RDL) coupled to the semiconductor die and the bussing lines, forming an insulating layer over the conductive layer and the embedded die panel that comprises openings disposed over the conductive layer outside a footprint of the semiconductor die, forming interconnect structures in the openings in the insulating layer by using the conductive layer as part of an electroplating process, and singulating the embedded die panel through the saw streets after forming the interconnect structures, wherein singulating removes at least a portion of the bussing lines and forms individual fan-out wafer level packages (FOWLPs).

The method of making the semiconductor device can further comprise forming the embedded die panel by providing a carrier, mounting the plurality of semiconductor die over the carrier, and disposing an encapsulant around each of the plurality of semiconductor die and around a copper post coupled to each of the plurality of semiconductor die. The method can further comprise, forming the conductive layer with a first thickness, and forming the interconnect structures with a second thickness greater than the first thickness. The method can further comprise forming the FOWLPs comprising a thickness less than or equal to 0.6 millimeters. The method can further comprise, forming the interconnect structures using a plating jig or a cover plate comprising a seal that contacts an edge of the embedded die panel and conducts current through the bussing structure to form the interconnect structures. The method can further comprise forming the conductive layer using adaptive patterning to align the conductive layer with a true position of the plurality of semiconductor die.

In another aspect, the present invention is a method of making a semiconductor device comprising providing an embedded die panel comprising a plurality of semiconductor die separated by saw streets, forming a conductive layer over the embedded die panel that extends from the semiconductor die into the saw streets, forming an insulating layer over the conductive layer and over the embedded die panel to comprise openings disposed over the conductive layer outside a footprint of the semiconductor die, forming interconnect structures in the openings in the insulating layer by using the conductive layer as part of a plating process, and singulating the embedded die panel through the saw streets to remove a portion of the conductive layer in the saw streets.

The method of making the semiconductor device can further comprise forming the conductive layer to include a ground pad exposed at an outer surface of the semiconductor device and at least partially overlapping the semiconductor die. The method can further comprise forming a conductive seed layer over the embedded die panel, forming the conductive layer as a conductive pattern layer over the seed layer on the embedded die panel that extends from the semiconductor die into the saw streets, and removing the exposed conductive seed layer from the embedded die panel. The method can further comprise forming copper posts disposed between the semiconductor die and the conductive layer. The method can further comprise forming the interconnect structures using a plating jig or a cover plate comprising a seal. The method can further comprise forming the conductive layer using adaptive patterning to align the conductive layer with a true position of the plurality of semiconductor die. The method can further comprise forming the insulating layer to comprise openings disposed over the conductive layer inside a footprint of the semiconductor die.

In another aspect, the present invention is a method of making a semiconductor device comprising providing a semiconductor die surrounded by saw streets, forming a conductive layer that extends from over the semiconductor die into the saw streets, forming an interconnect structure on the conductive layer, and removing a portion of the conductive layer from the saw streets.

The method of making the semiconductor device can further comprise forming the conductive layer over a conductive seed layer by a first electroless plating process, removing a portion of the conductive seed layer, and forming the interconnect structure on the conductive layer after removing the portion of the conductive seed layer by using the conductive layer as part of a second electroplating process. The method can further comprise forming copper posts disposed between the semiconductor die and the conductive layer. The method can further comprise forming a first portion of the conductive layer as a ground pad exposed within a footprint of the semiconductor die, forming a second portion of the conductive layer as bussing lines disposed in the saw streets, forming a third portion of the conductive layer as a contact pad coupled to the interconnect structure, and forming a fourth portion of the conductive layer as a redistribution layer coupled to the semiconductor die and the contact pad. The method can further comprise forming the first, second, third, and fourth portions of the conductive layer as being electrically common, and removing the bussing lines disposed in the saw streets such that portions of the conductive layer are no longer electrically common. The method can further comprise forming the interconnect structure using a plating jig. The method can further comprise forming the conductive layer using adaptive patterning to align the conductive layer with a true position of the semiconductor die.

BRIEF DESCRIPTION OF THE DRAWINGS

FIGS. 2A-2M illustrate a method of forming a FOWLP in accordance with an embodiment of the disclosure.

DETAILED DESCRIPTION

Figure 1A:
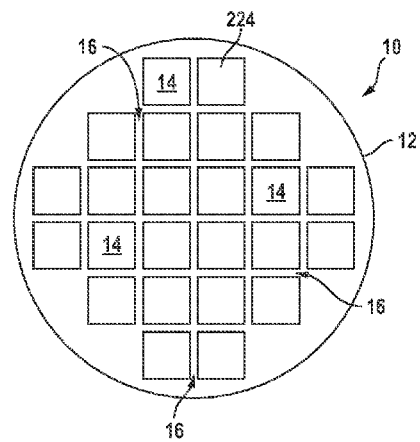
FIGS. 1A-1D illustrate a plurality of semiconductor die for use in a FOWLP in accordance with an embodiment of the disclosure.

The present disclosure includes one or more embodiments in the following description with reference to the figures, in which like numerals represent the same or similar elements. While the description is written in terms of the best mode, it will be appreciated by those skilled in the art that it is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIGS. 1A-1D show a plurality of semiconductor die that have been formed according to front-end manufacturing methods and procedures as outlined above. More specifically, FIG. 1A shows a semiconductor wafer 10 with a base substrate material 12, such as, without limitation, silicon, germanium, gallium arsenide, indium phosphide, or silicon carbide, for structural support. A plurality of semiconductor die or components 14 is formed on wafer 10 separated by a non-active, inter-die wafer area or saw street 16 as described above. Saw streets 16 provide cutting areas to singulate semiconductor wafer 10 into individual semiconductor die 14.

Figure 1B:
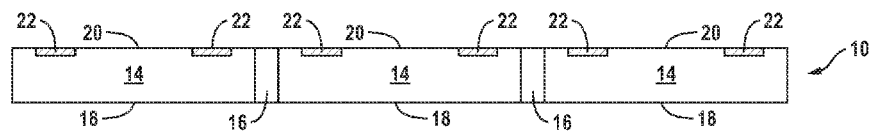

FIG. 1B shows a cross-sectional view of a portion of semiconductor wafer 10. Each semiconductor die 14 has a backside or back surface 18 and an active surface 20 opposite the backside. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Semiconductor die 14 may also contain IPDs such as inductors, capacitors, and resistors, for RF signal processing.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), tin (Sn), nickel (Ni), gold (Au), silver (Ag), or other suitable electrically conductive material. Conductive layer 22 operates as contact pads or bond pads electrically coupled or connected to the circuits on active surface 20. Conductive layer 22 can be formed as contact pads disposed side-by-side a first distance from the edge of semiconductor die 14, as shown in FIG. 1B. Alternatively, conductive layer 22 can be formed as contact pads that are offset in multiple rows such that a first row of contact pads is disposed a first distance from the edge of the die, and a second row of contact pads alternating with the first row is disposed a second distance from the edge of the die.

Figure 1C:
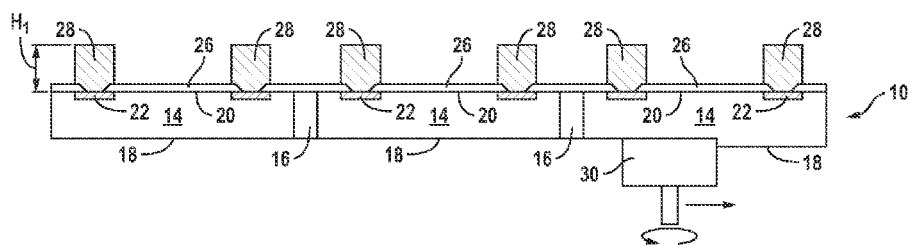

FIG. 1C shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1C also shows electrical interconnect structures 28 are formed as copper columns, copper pillars, or copper posts and are disposed over, and coupled or connected to, conductive layer 22. Interconnect structures 28 can be formed directly on conductive layer 22 using patterning and metal deposition processes such as printing, PVD, CVD, sputtering, electrolytic plating, electroless plating, metal evaporation, metal sputtering, or other suitable metal deposition process. Interconnect structures 28 can be one or more layers of Al, Cu, Sn, Ni, Au, Ag, palladium (Pd), or other suitable electrically conductive material and can include one or more UBM layers. In an embodiment, a photoresist layer is deposited over semiconductor die 14 and conductive layer 22. A portion of photoresist layer is exposed and removed by an etching development process. Electrical interconnect structures 28 are formed as copper pillars in the removed portion of the photoresist and over conductive layer 22 using a selective plating process. The photoresist layer is removed leaving interconnect structures 28 that provide for subsequent mechanical and electrical interconnection and a standoff with respect to active surface 20 and insulating layer 26, if present. Preferably, interconnect structures 28 include a height H1 in a range of 10-100 micrometers (μm). More preferably, interconnect structures 28 include a height in a range of 20-50 μm. Most preferably, interconnect structures 28 include a height of about 35 μm.

FIG. 1C further shows wafer 10 undergoes an optional grinding operation with grinder 30 to planarize back surface 18 and reduce a thickness of the wafer. A chemical etch can also be used to remove and planarize a portion of wafer 10.

Figure 1D:
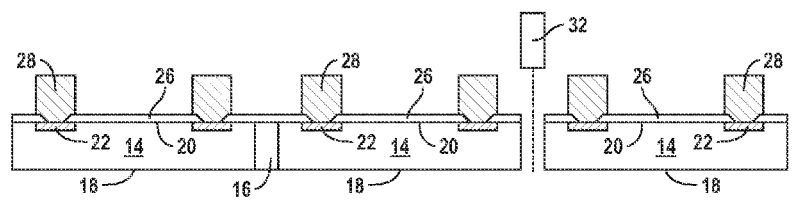

FIG. 1D shows after the formation of interconnect structures 28 and the optional grinding of wafer 10, wafer 10 is singulated through saw streets 16 using a saw blade or laser cutting tool 32 into individual semiconductor die 14.

FIG. 2A shows a carrier or substrate 36 containing temporary or sacrificial base material such as silicon, polymer, stainless steel, or other suitable low-cost, rigid material for structural support. An optional interface layer or double-sided tape 38 is formed over carrier 36 as a temporary adhesive bonding film or etch-stop layer. In an embodiment, carrier 36 is a ring-shaped film frame comprising an open center portion that supports tape 38 at a periphery of the tape as shown in FIG. 2B.

FIG. 2A further shows semiconductor die 14 from FIG. 1D mounted face up to carrier 36 and interface layer 38 with backside 18 oriented towards the substrate and active surface 20 oriented away from the carrier. Semiconductor die 14 can be placed over carrier 36 using a pick and place operation or other suitable operation. An adhesive 41 is optionally disposed between backside 18 of semiconductor die 14 and carrier 36. Adhesive 41 can be thermal epoxy, epoxy resin, B-stage epoxy film, ultraviolet (UV) B-stage film with optional acrylic polymer, or other suitable material. In an embodiment, adhesive 41 can be disposed over backside 18 before semiconductor die 14 are mounted over carrier 36. Alternatively, adhesive 41 can be disposed on carrier 36 before mounting the semiconductor die to the carrier. In other embodiments, as shown in FIG. 2B, semiconductor die 14 are mounted directly to interface layer or support tape 38 without use of adhesive 41.

Semiconductor die 14 are mounted to carrier 36 such that the semiconductor die are separated by a space or gap 40 when mounted over carrier 36 that provides an area for a subsequently formed fan-out interconnect structure including bussing lines. A size of gap 40 includes sufficient area for optionally mounting semiconductor devices or components within the subsequently formed FOWLPs.

FIG. 2C shows an encapsulant 42 is deposited using a paste printing, compression molding, transfer molding, liquid encapsulant molding, lamination, vacuum lamination, spin coating, or other suitable applicator. Specifically, FIG. 2C shows a mold 44 with a plurality of sidewalls 46 brought together with top portion or plate 45, carrier 36, and interface layer 38 to enclose semiconductor die 14 within the mold for subsequent encapsulation. Mold 44 can also include a bottom portion on which carrier 36 is placed and to which sidewalls 46 can be in contact. In an embodiment, carrier 36 and interface layer 38 serve as the bottom mold portion for the subsequent encapsulation process. Alternatively, semiconductor die 14, carrier 36, and interface layer 38 may be disposed within a mold including multiple portions, such as top and bottom portions. Mold 44 is brought together by moving mold 44 around semiconductor die 14, or alternatively, by moving the semiconductor die into the mold.

FIG. 2C further shows mold 44 encloses semiconductor die 14 with a cavity or open space 50. Cavity 50 extends between mold 44 to semiconductor die 14 and interface layer 38. A volume of encapsulant 42 is disposed over semiconductor die 14 and carrier 36. Inlet 48 can be an exhaust port with optional vacuum assist 54 for providing a vacuum in cavity 50; however, inlet 48 does not provide an escape path for encapsulant 42. Encapsulant 42 can be a polymer composite material, such as epoxy resin with filler, epoxy acrylate with filler, or polymer with proper filler. The volume of encapsulant 42 is measured according to the space requirements of cavity 50 less the area occupied by semiconductor die 14 and any additional semiconductor devices that might be present. Encapsulant 42 is disposed over semiconductor die 14 and between sidewalls 44. Top portion 45 of mold 44 moves along sidewalls 46 toward encapsulant 42 and semiconductor die 14 until the top portion contacts the encapsulant to evenly disperse and uniformly distribute encapsulant 42 within cavity 50 around semiconductor die 14. A viscosity and elevated temperature of encapsulant 42 can be selected for uniform coverage, for example, a lower viscosity and elevated temperature can increase the flow of the encapsulant for molding, paste printing, and spin coating. The temperature of encapsulant 42 can also be controlled within cavity 50 to promote curing of the encapsulant. Semiconductor die 14 are embedded together in encapsulant 42, which is non-conductive and environmentally protects the semiconductor device from external elements and contaminants.

Figure 2H:
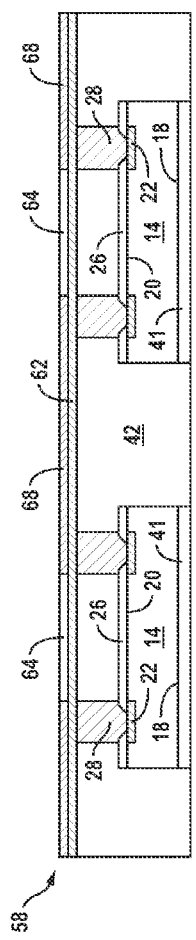

FIG. 2D shows an encapsulation process similar to the process described in relation to FIG. 2C. FIG. 2D differs from FIG. 2C by the orientation of semiconductor die 14 relative to carrier 36 and interface layer 38. Instead of mounting semiconductor die 14 face up with active surface 20 oriented away from carrier 36 as shown in FIG. 2C, FIG. 2D shows an embodiment in which semiconductor die 14 are mounted face down with active surface 20 oriented toward carrier 36. Accordingly, adhesive 41 can be omitted from over back surface 18 of semiconductor die 14. Furthermore, while the processing shown subsequently in FIGS. 2E-2M is shown with respect to the packaging of semiconductor die 14 illustrated in FIG. 2C, the subsequent processing is likewise applicable to the packaging illustrate in FIG. 2D.

In FIG. 2E, semiconductor die 14 are removed from mold 44, and panel 58 optionally undergoes a curing process to cure encapsulant 42. Carrier 36 and interface layer 38 are removed by chemical etching, mechanical peeling, CMP, mechanical grinding, thermal bake, UV light, laser scanning, or wet stripping to expose encapsulant 42. A surface of encapsulant 42 can be substantially coplanar with adhesive 41. Alternatively, encapsulant 42 can be substantially coplanar with backside 18, the encapsulant being exposed by the removal of carrier 36 and interface layer 38. After removal of carrier 36 and interface layer 38, FIG. 2E shows encapsulant 42 disposed around semiconductor die 14 to form an embedded die panel 58. Panel 58 includes a footprint or form factor of any shape and size that allows for, and facilitates, the subsequent processing required to form FOWLPs as described in greater detail below. In an embodiment, panel 58 includes a form factor similar to the form factor of a 300 millimeter (mm) semiconductor wafer and includes a circular footprint having a diameter of 300 mm.

FIG. 2E also shows panel 58 undergoes an optional grinding operation with grinder 60 to planarize the surface and reduce a thickness of the panel. A chemical etch can also be used to remove and planarize a portion of encapsulant 42 in panel 58. Thus, a surface of interconnect structures 28 is exposed with respect to encapsulant 42 at a periphery of panel 58 to provide for electrical connection between semiconductor die 14 and a subsequently formed fan-out interconnect structure.

FIG. 2F shows an electrically conductive layer 62 is formed over panel 58 as a seed layer. Conductive layer 62 can be one or more layers of Al, Cu, Sn, Ni, Au, Ag, Ti/Cu, TiW/Cu, or a coupling agent/Cu. The seed layer is deposited by sputtering, by electroless plating, by depositing laminated Cu foil combined with electroless plating, or other suitable process. In an embodiment, conductive layer 62 is planar and covers an entirety of a footprint of panel 58. Thus, conductive layer 62 can cover both the top surface or an area over semiconductor die 14 as well as a peripheral area disposed outside a footprint of the semiconductor die, such as gaps 40.

FIG. 2F further shows insulating or passivation layer 64 is conformally applied over panel 58 and contacts conductive layer 62. Insulating layer 64 can be one or more layers that are applied using PVD, CVD, screen printing, spin coating, spray coating, sintering, or thermal oxidation. Insulating layer 64 contains one or more layers of SiO2, Si3N4, SiON, Ta2O5, Al2O3, polyimide, BCB, PBO or other material having similar insulating and structural properties. In an embodiment, insulating layer 64 is a dry film resist layer.

In FIG. 2G, insulating layer 64 is patterned and a portion the insulating layer is removed by etching, laser drilling, mechanical drilling, or other suitable process to form openings 66 completely through insulating layer 64 and to expose conductive layer 62. Insulating layer 64 is patterned to facilitate the formation of bussing structures in gaps 40 and in saw streets disposed between semiconductor die 14 and at edges of panel 58. Insulating layer 64 is also patterned to facilitate the formation of contact pads and redistribution layers (RDLs) as part of a fan-out interconnect structure for semiconductor 14 that are coupled or connected to the bussing structures when plated as described in greater detail below.

When positions of semiconductor die 14 and interconnect structures 28 shift from nominal positions such as during placement and encapsulation of the semiconductor die for formation of panel 58, the true or actual positions of the semiconductor die may not sufficiently align with the nominal design of the fan-out interconnect structure to provide desired reliability for package interconnections given desired routing densities and pitch tolerances. When shifts in the positions of semiconductor die 14 are small, no adjustments to the positions of openings 66 in insulating layer 64 may be required to properly align the openings with interconnect structures 28. However, when changes in the positions of semiconductor die 14 and interconnect structures 28 are such that the nominal position of openings 66 do not provide adequate alignment with, and exposure to, the interconnect structures, then adjustments to the position of openings 66 can be made by adaptive patterning as described in greater detail in U.S. patent application Ser. No. 13/891,006, filed May 9, 2013, the disclosure of which is hereby incorporated herein by reference. Adaptive patterning can optionally adjust the position of openings 66 for each semiconductor die 14 individually, or can adjust positions for a number of semiconductor die 14 simultaneously. The position, alignment, or position and alignment of openings 66 can be adjusted by an x-y translation or by rotation of an angle θ with respect to their nominal positions or with respect to a point of reference or fiducial on panel 58.

FIG. 2H, continuing from FIG. 2G, shows a cross-sectional view of a portion of panel 58 in which electrically conductive layer or conductive pattern layer 68 is patterned and deposited over encapsulant 42, interconnects 28, and conductive layer 63, to form a bussing layer, contact pads, and RDLs as part of a fan-out interconnect structure. Conductive layer 68 can be one or more layers of Al, Cu, Sn, Ni, Au, Ag, or other suitable electrically conductive material. The deposition of conductive layer 68 can use wafer-like processing that includes a seed and blanket layer formed as part of an additive process on a molded panel, such as PVD, CVD, electrolytic plating, electroless plating, or other suitable process. In an embodiment, conductive layer 68 is formed over conductive layer 62 by a plating process that uses conductive layer 62 as a plating surface. Conductive layer 68 can also be formed using adaptive patterning to align the conductive layer with a true position of a plurality of semiconductor die. Conductive layer 68 comprises a thickness in a range of 1-10 micrometers (μm), preferably in a range of 2-6 μm, and more preferably having a thickness of about 4 μm. Conductive layer 68 provides mechanical and electrical interconnection between electrical interconnect structures 28 and subsequently formed bumps or package interconnect structures that provide for the transmission of electrical signals between semiconductor die 14 and points external to the FOWLP.

Figure 2I:
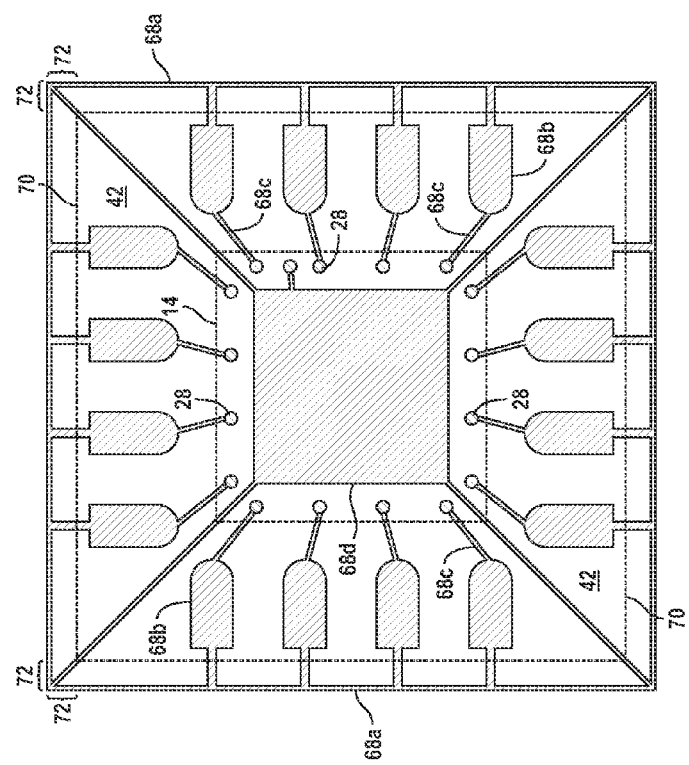

FIG. 2I shows a plan view of a portion of panel 58 similar to the portion previously shown in cross-sectional view in FIG. 2H. FIG. 2I shows semiconductor die 14 embedded within encapsulant 42 as part of a FOWLP having a package outline 70 surrounded by saw street 72. Conductive layer 68 is shown formed into a number of features 68a-68d as part of the FOWLP. Conductive layer 68 includes bussing lines or a bussing structure 68a that connect various features of conductive layer 68 and facilitate plating of conductive layer 68 and also facilitate the subsequent plating of additional conductive material for the formation of input/output (I/O) interconnect structures. A portion of bussing lines 68 are formed in saw streets 72, can surround a periphery of the FOWLP, and are subsequently removed during singulation of individual FOWLPs through the saw streets. Conductive layer 68 also includes contact pads 68b that provide a location for the subsequent formation of package I/O interconnects. Contact pads 68b are mechanically and electrically coupled or connected to interconnects 28 by RDLs 68c. Contact pads 68b can be disposed side-by-side a first distance from package outline 70. Alternatively, contact pads 68b are offset in multiple rows such that a first row of contact pads is disposed a first distance from package outline 70, and a second row of contact pads alternating with the first row is disposed a second distance from the package outline. A portion of conductive layer 68 is optionally formed as part of a center exposed ground pad or die flag 68d that is coupled or connected to ground in semiconductor die 14 through an interconnect 28. In an embodiment, ground pad 68d, either alone or with additional conductive material, is exposed at a bottom surface or at a periphery of the completed semiconductor device and is disposed entirely within a footprint of semiconductor die 14. Alternatively, ground pad 68d is disposed partially within a footprint of semiconductor die 14. Thus, conductive layer 68 can be initially formed such that bussing lines 68a, contact pads 68b, RDLs 68c, and ground pad 68d are electrically common before the removal of bussing lines 68a. After the removal of bussing lines 68a, as described below with respect to FIG. 2L, RDLs 68c are not electrically common and are electrically discrete.

FIG. 2J shows panel 58 after the removal of insulating layer 64 and removal of the portion of conductive layer 62 contained within a footprint of insulating layer 64 after the formation of openings 66. Stated another way, the portion of conductive layer 62 not covered by conductive layer 68 is removed to facilitate the subsequent formation of additional conductive structures by a plating process without causing electrical shorting within the FOWLP. In an embodiment, insulating layer 64 is a resist layer that is removed by a stripping process and conductive layer 62 is a seed layer removed by an etching process. Alternatively, insulating layer 64 remains as part of the final structure of the FOWLP, in which case conductive layer 62 has been patterned to avoid electrical shorting within the FOWLP. In an embodiment, the processing of panel 58 as described through FIG. 2J is accomplished using wafer-like processing; whereas, the processing of panel 58 as shown in FIGS. 2K and 2L is accomplished using PCB-like processing, as described below.

FIG. 2K shows an insulating or passivation layer 74 conformally applied over panel 58, encapsulant 42, and conductive layer 68. Insulating layer 74 includes one or more layers that are applied using PVD, CVD, screen printing, spin coating, spray coating, sintering, or thermal oxidation. Insulating layer 74 contains one or more layers of SiO2, Si3N4, SiON, Ta2O5, Al2O3, polyimide, BCB, PBO or other material having similar insulating and structural properties. Alternatively, semiconductor die 14 are packaged without the use of any PBO layers. In an embodiment, passivation layer 74 is a dry film resist including a thickness in a range of 5-50 µm, or more preferably, in a range of 10-35 µm.

FIG. 2K also shows a portion of insulating layer 74 is removed by etching, laser drilling, mechanical drilling, or other suitable process to form openings 76 completely through insulating layer 74 to expose at least a portion of conductive layer 68 for subsequent mechanical and electrical interconnection. Openings 76 are formed in insulating layer 74 over contact pads 68b. A location of openings 76 is not determined by the adaptive patterning employed in adjusting a location of openings 66 in insulating layer 64 or adjusting a location of conductive layer 68. Instead, the location of openings 76, and thus the location of subsequently formed package I/O interconnects, remains fixed with respect to package outline 70 of the FOWLPs and does not vary with movement or shifting of semiconductor die 14.

In FIG. 2L, package I/O interconnect structures 78 are formed within openings 76 and over conductive layer 68. In an embodiment, an optional UBM layer is disposed between conductive layer 68 and interconnect structures 78. Interconnect structures 78 can be one or more layers of Al, Cu, Sn, Ni, Au, Ag, or other suitable electrically conductive material. The deposition of conductive layer 68 uses PVD, CVD, electrolytic plating, electroless plating, or other suitable process. In an embodiment, interconnect structures 78 are formed using a PCB-like process by electroplating a Cu cap in opening 76 by using bussing lines 68c of conductive layer 68 as a plating surface, which can be similar to the use of bussing structures employed during PCB manufacturing. By using bussing lines 68c for the plating of interconnect structures 78, the need of forming an additional seed layer for the plating of the interconnects structures is alleviated, thereby simplifying processing, reducing cost, and increasing efficiency. A solderable surface finish 79 is optionally formed over interconnect structures 78. The solderable surface finish can be Sn, solder, nickel gold (NiAu), nickel palladium (NiPd), nickel palladium gold (NiPdAu), Ag, or another suitable material.

In an embodiment, the plating of interconnect structures 78 is accomplished by using a plating jig or a modified cover plate 80 comprising a seal as described in greater detail in U.S. Provisional Patent Application No. 61/305,121 and US Pub. No. 2011/0308955, the disclosures of each of which are incorporated herein in their entireties by this reference. Thus, a first jig or modified cover plate comprising a seal can be used in the formation of conductive layer 68 by placing the first jig in electrical contact with electrically conductive layer or seed layer 62 at a first contact area and then plating conductive layer 68. A second jig or modified cover plate comprising a seal can be used for the formation of interconnect structures 78. The second jig can be placed on the first contact area to make electrical contact for plating of interconnect structures 78. More preferably, the second jig is placed so as to contact a second contact area on conductive layer 68 that is electrically common and different from the first contact area. For example, the second contact area can be located at bussing lines 68a on the edge of panel 58 or at RDL 68c. Alternatively, the second contact area can be the same as the first contact area. The second contact area can be different from the first contact area because the first contact area does not necessarily extend to a level to which the interconnect structures 78 are plated, and the first contact area might be removed with the removal of portions of conductive or seed layer 62. The second contact area provides for electrical contact that allows for plating of interconnect structures 78 with the second jig. By electroplating a Cu cap in opening 76 in insulating layer 74 by using bussing lines 68a and contact pads 68b of conductive layer 68 as a plating surface, the need of forming an additional seed layer for the plating of interconnects structures 78 is alleviated, thereby simplifying processing, reducing cost, and increasing efficiency.

Advantageously, interconnect structures 78 can be formed with a "mushroom shape" that includes a first portion 78a comprising a first width or diameter D1 within opening 76 and a second portion 78b comprising a second width or diameter D2 outside of opening 76. D2 is greater than D1 such that a footprint of second portion 78b has a footprint greater than a footprint of first portion 78a. Second portion 78b includes a rounded first surface comprising a spherical shape and second surface opposite the first surface that is planar and in contact with insulating layer 74. In an embodiment, solderable surface finish 79 is formed over the round first surface of second portion 78b. A position or footprint of interconnect structures 78 can be disposed completely outside a footprint of semiconductor die 14 as part of a fan-out interconnect structure such that the interconnect structures are formed in a peripheral area 77 around the semiconductor die. Alternatively, a footprint of interconnect structures 78 can be partially outside a footprint of semiconductor die 14 or completely within a footprint of the semiconductor die.

After the formation of interconnect structures 78, panel 58 is singulated through saw streets 72 using a saw blade or laser cutting tool into individual FOWLPs 82. By singulating panel 58 through saw streets 72, the portions of bussing lines 68a used for the plating of interconnect structures 78 and located within the saw streets is removed. The removal of bussing lines 68a segments conductive layer 68 into discrete portions that are electrically isolated with respect to each other and prevents electrical shorting with respect to RDLs 68c within FOWLPs 82.

FIG. 2M shows a plan view of a portion of panel 58 similar to the portion of panel 58 shown in cross-sectional view in FIG. 2L. FIG. 2M shows semiconductor die 14 embedded within encapsulant 42 as part of unsingulated FOWLPs 82 indicated by package outlines 70, which are surrounded by saw streets 72. Conductive layer 68 is shown formed into a number of features 68a-68d. Conductive layer 68 includes bussing lines 68a that connect various features of conductive layer 68 among FOWLPs 82 and facilitate plating of conductive layer 68 and of interconnect structures 78. As indicated above, by singulating panel 58 through saw streets 72, the portions of bussing lines 68a located within the saw streets is removed to form conductive layer 68 into discrete portions that are electrically isolated with respect to each other, thereby preventing electrical shorting within FOWLPs 82 through bussing lines 68a.

Figure 3:
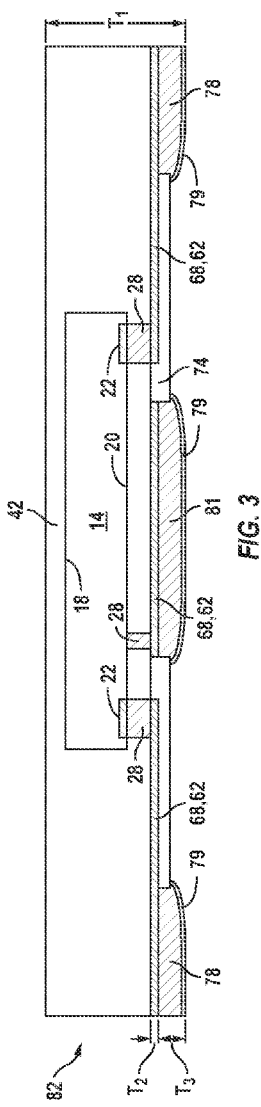
FIG. 3 illustrates an embodiment of a FOWLP in accordance with an embodiment of the disclosure.

FIG. 3, continuing from FIG. 2L, shows a cross-sectional view of a completed FOWLP 82. FOWLP 82 includes a footprint that is compatible with a footprint of a dual row QFN package. Optionally, FOWLP 82 is formed without inclusion of PBO layers. FOWLP 82 can also include center exposed ground pad or die flag comprising conductive layer 81 that is formed over center exposed ground pad 68d at a same time and using the same process as the formation of interconnect structures 78. The optional ground pad comprising one or more conductive layers such as conductive layer 81 and center exposed ground pad 68d can be disposed at an outer surface of the FOWLP to provide a ground connection between the FOWLP and the device or substrate to which the FOWLP is mounted. Advantageously, an overall package thickness T1 of FOWLP 82 can be less than or equal to 0.6 mm, thereby providing a low profile package for space sensitive applications. A thickness of conductive layers 62 and 68 can include a thickness T2 less than a thickness T3 of interconnect structures 78. In an embodiment, the processing of panel 58 with the formation of conductive layer 68 is accomplished using wafer-like processing. Interconnect structures 78 are formed using a PCB-like process by electroplating a Cu cap in opening 76 in insulating layer 74 by using bussing lines 68a and contact pads 68b of conductive layer 68 as a plating surface. By using conductive layer 68 for the plating of interconnect structures 78, the need of forming an additional seed layer for the plating of the interconnects structures is alleviated, thereby simplifying processing, reducing cost, and increasing efficiency. The formation of interconnect structure 78 can be accomplished with the use of a plating jig or a modified cover plate comprising a seal that contacts conductive layer 68, and more specifically bussing lines 68a on the edge of panel 58. The formation and patterning of insulating layer 64 and conductive layer 68 can be accomplished with the use of adaptive patterning to account for changes from a nominal position to a true position of semiconductor die 14 within panel 58.

Thus, FOWLP 82 includes interconnect structures 78 and conductive layer 81 with surface finish 79 that comprise a mushroom shape. Each of the mushroom shaped interconnect structures 78 is connected to a bussing line 68a that is exposed at a side of individual FOWLPs 82 after the FOWLPs are removed from panel 58. Because bussing lines 68a are formed across panel 58 and separated with the singulation or sawing of individual FOWLPs 82, the bussing lines extend to edges of FOWLPs 82. Typically, conventional FOWLPs do not include busing lines extending to package edges. Instead, conductive layers are formed in openings in photopolymers that do not extend to a package edge because the photopolymer tend to easily chip and crack when sawn. Accordingly, the photopolymers and conductive layers are held back from an edge of the package such that the photopolymers do not chip and crack during sawing such that the conductive layers formed in openings in the photopolymers also do not extend to a package edge.

Accordingly, forming FOWLP 82 as described with respect to FIGS. 1A-3 reduces processing cost by forming conductive layer 68 and bussing lines 68c by using passivation layer 74 as a plating template for the formation of interconnect structures 78 and eliminating a need for forming and removing a temporary second masking layer for the formation of the interconnect structures. Furthermore, by electroplating interconnect structures 78 using bussing lines 68c of conductive layer 68 as a plating surface to form interconnect structures that are thicker than conventional RDLs, a more interconnect structure is provided that is conducive for using FOWLP 82 in surface mount applications.

Figure 4:
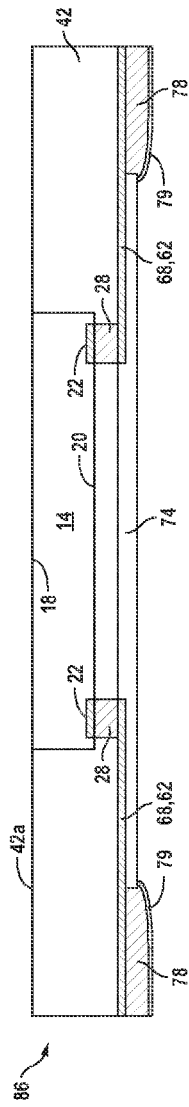
FIG. 4 illustrates another embodiment of a FOWLP comprising a semiconductor die with an exposed back surface in accordance with an embodiment of the disclosure.

FIG. 4 shows a FOWLP 86, similar to FOWLP 82 shown in FIG. 3. FOWLP 86 shows back surface 18 of semiconductor die 14 is exposed with respect to encapsulant 42 and is coplanar or substantially coplanar with a first or top surface 42a of the encapsulant. Back surface 18 can be exposed with respect to encapsulant 42 because the back surface is mounted directly to interface layer or double-sided tape 38 as shown and described in relation to FIG. 2B; or, because encapsulant 42 undergoes a grinding operation to reduce a thickness of encapsulant 42 and to expose back surface 18. FOWLP 86 can also include an optional center exposed ground pad or die flag as described above and illustrated, for example, in FIG. 3.

Figure 5:
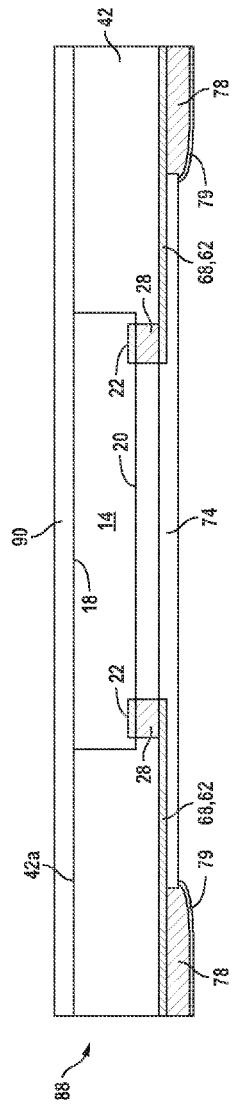
FIG. 5 illustrates another embodiment of a FOWLP comprising a coating layer in accordance with an embodiment of the disclosure.

FIG. 5 shows a FOWLP 88, similar to FOWLP 86 shown in FIG. 4. FOWLP 88 shows back surface 18 of semiconductor die 14 is exposed with respect to encapsulant 42 and is coplanar or substantially coplanar with a first or top surface 42a of the encapsulant. Back surface 18 can be exposed with respect to encapsulant 42 because the back surface is mounted directly to interface layer or double-sided tape 38 as shown and described in relation to FIG. 2B; or because encapsulant 42 undergoes a grinding operation to reduce a thickness of encapsulant 42 and to expose back surface 18.

FIG. 5 further shows FOWLP 88 includes an optional coating or film 90 deposited over, or on, back surface 18 of semiconductor die 14 and surface 42a of encapsulant 42 using a printing, spraying, molding, spin coating, lamination, or other suitable applicator. Coating 90 can be polymer or polymer composite material, such as epoxy resin with filler, epoxy acrylate with filler, polymer with proper filler, compliant epoxy film, dielectric layer, or dielectric film containing one or more layers of $SiO_2$, $Si_3N_4$, SiON, $Ta_2O_5$, $Al_2O_3$, polyimide, BCB, PBO, or other material having similar insulating and structural properties. In a preferred embodiment, coating 90 is an epoxy film applied using a laminating process. Coating 90 is non-conductive, provides physical support, and environmentally protects the semiconductor device from external elements and contaminants. Coating 90 can also be configured to reduce or minimize warpage of FOWLP 88.

FOWLP 88 can also include an optional center exposed ground pad or die flag as described above and illustrated, for example, in FIG. 3.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a plurality of fan-out wafer level packages (FOWLPs), comprising:
  providing an embedded die panel comprising a plurality of semiconductor die separated by saw streets formed of encapsulant;
  forming a planar conductive layer by an electroplating process, the planar conductive layer comprising:
    planar bussing lines disposed in the saw streets, and
    a planar redistribution layer (RDL) formed at a same level as an entirety of the planar bussing lines, the planar RDL being coupled to each of the plurality of semiconductor die and the planar bussing lines;
  forming an insulating layer over the planar conductive layer and the embedded die panel that comprises openings disposed over the planar conductive layer outside a footprint of each of the plurality of semiconductor die;
  forming interconnect structures in the openings in the insulating layer by using the planar conductive layer as a base layer during an electroplating process; and
  singulating the embedded die panel through the saw streets after forming the interconnect structures, wherein singulating removes at least a portion of the planar bussing lines and forms the plurality of FOWLPs, wherein each of the plurality of FOWLPs comprises a portion of the planar RDL vertically disposed between a contact pad of one of the plurality of semiconductor die and one of the interconnect structures.

2. The method of claim 1, further comprising forming the embedded die panel by:
  providing a carrier;

mounting the plurality of semiconductor die over the carrier; and disposing an encapsulant around each of the plurality of semiconductor die and around a plurality of copper posts, wherein each of the plurality of semiconductor die is coupled to at least one copper post from the plurality of copper posts.

3. The method of claim 1, further comprising:

forming the planar conductive layer with a first thickness; and forming the interconnect structures with a second thickness greater than the first thickness.

4. The method of claim 1, further comprising forming the FOWLPs comprising a thickness less than or equal to 0.6 millimeters.

5. The method of claim 1, further comprising forming the interconnect structures with a plating jig or a cover plate.

6. The method of claim 1, further comprising forming the planar conductive layer with adaptive patterning to align the planar conductive layer with a true position of the plurality of semiconductor die.

7. A method of making a plurality of fan-out wafer level packages (FOWLPs), comprising:

providing an embedded die panel comprising a plurality of semiconductor die separated by saw streets formed of encapsulant;

forming a planar conductive layer over the embedded die panel that extends from each of the plurality of semiconductor die into the saw streets, the planar conductive layer comprising:

bussing lines, and an RDL formed at a same level as the bussing lines;

forming an insulating layer over the planar conductive layer and over the embedded die panel to comprise openings disposed over the planar conductive layer outside a footprint of each of the plurality of semiconductor die;

forming interconnect structures in the openings in the insulating layer by using the planar conductive layer as a base layer during a plating process; and singulating the embedded die panel through the saw streets to remove a portion of the planar conductive layer in the saw streets and form the plurality of FOWLPs, wherein each of the plurality of FOWLPs comprises a portion of the RDL vertically disposed between a contact pad of one of the plurality of semiconductor die and one of the interconnect structures.

8. The method of claim 7, further comprising forming a ground pad over the planar conductive layer, the ground pad being exposed at an outer surface of the semiconductor device and at least partially overlapping one of the plurality of semiconductor die.

9. The method of claim 7, further comprising:

forming a conductive seed layer over the embedded die panel;

forming the planar conductive layer as a conductive pattern layer over the seed layer on the embedded die panel that extends from each of the plurality of semiconductor die into the saw streets; and removing the exposed conductive seed layer from the embedded die panel.

10. The method of claim 7, further comprising forming a copper post disposed between each of the plurality of semiconductor die and the planar conductive layer.

11. The method of claim 7, further comprising forming the interconnect structures with a plating jig or a cover plate.

12. The method of claim 7, further comprising forming the planar conductive layer with adaptive patterning to align the planar conductive layer with a true position of the plurality of semiconductor die.

13. The method of claim 9, further comprising forming the insulating layer to comprise openings disposed over the planar conductive layer inside a footprint of each of the plurality of semiconductor die.

14. A method of making a plurality of fan-out wafer level packages (FOWLPs), comprising:

providing a semiconductor die surrounded by saw streets;

forming a planar conductive layer that extends from over the semiconductor die into the saw streets;

forming an interconnect structure on the planar conductive layer; and removing a portion of the planar conductive layer from the saw streets to form the plurality of fan-out wafer level packages.

15. The method of claim 14, further comprising:

forming the planar conductive layer over a conductive seed layer by a first electroplating process;

removing a portion of the conductive seed layer; and forming the interconnect structure on the planar conductive layer after removing the portion of the conductive seed layer by using the planar conductive layer as a base layer as part of a second electroplating process.

16. The method of claim 15, further comprising forming a copper post disposed between the semiconductor die and the planar conductive layer.

17. The method of claim 15, wherein forming the planar conductive layer further comprises:

forming a first portion of the planar conductive layer as a ground pad exposed within a footprint of the semiconductor die;

forming a second portion of the planar conductive layer as bussing lines disposed in the saw streets;

forming a third portion of the planar conductive layer as a contact pad coupled to the interconnect structure; and forming a fourth portion of the planar conductive layer as a redistribution layer coupled to the semiconductor die and the contact pad.

18. The method of claim 17, further comprising:

forming the first, second, third, and fourth portions of the planar conductive layer as being electrically common; and removing the bussing lines disposed in the saw streets such that portions of the planar conductive layer are no longer electrically common.

19. The method of claim 14, further comprising forming the interconnect structure with a plating jig.

20. The method of claim 14, further comprising forming the planar conductive layer with adaptive patterning to align the planar conductive layer with a true position of the semiconductor die.

* * * * *